(12) United States Patent  
Gjorup

(10) Patent No.: US 9,025,380 B1  
(45) Date of Patent: May 5, 2015

(54) MANAGEMENT OF DATA STORAGE IN A NON-VOLATILE MEMORY SYSTEM

(71) Applicant: Intel Corporation, Santa Clara, CA (US)

(72) Inventor: Karsten Gjorup, Aalborg (DK)

(73) Assignee: Intel Corporation, Santa Clara ( * ) Notice: Subject to any disclaimer, the term of this patent is extended or adjusted under 35 U.S.C. 154(b) by 0 days.

(21) Appl. No.: 14/098,715

(22) Filed: Dec. 6, 2013

(51) Int. Cl.  
*G11C 16/10* (2006.01)

(52) U.S. Cl.  
CPC .................................... *G11C 16/10* (2013.01)

(58) Field of Classification Search  
CPC .. G11C 16/10; G11C 16/3418; G11C 16/349; G11C 16/3495  
USPC .............. 365/185.12, 185.02, 185.09, 185.11  
See application file for complete search history.

(56) References Cited

U.S. PATENT DOCUMENTS

2012/0005402 A1* 1/2012 Yamamoto et al. ............ 711/103  
2013/0121075 A1* 5/2013 Hutchison et al. ....... 365/185.11

* cited by examiner

*Primary Examiner* — Tan T. Nguyen  
(74) *Attorney, Agent, or Firm* — Chapin IP Law, LLC

(57) ABSTRACT

According to one configuration, selection logic analyzes received attributes of particular data to be stored in a non-volatile memory system. Depending on present usage of storage cells in the non-volatile memory system and the attributes of the particular data to be stored, the selection logic selects a mode amongst multiple possible storage modes in which to store the particular data in the non-volatile memory system. Thereafter, the selection logic initiates storage of the particular data in the non-volatile memory system in accordance with the selected storage mode.

25 Claims, 10 Drawing Sheets

MANAGEMENT OF DATA STORAGE IN A NON-VOLATILE MEMORY SYSTEM

BACKGROUND

Conventional computer systems typically include a file system to manage storage of data used by applications executing on a computer. In general, the file system controls how digital information is stored and retrieved from a corresponding data storage system.

Applications typically operate on data in files using logical addresses. The applications communicate with the file system to access data in the data storage system. A logical-to-physical translation layer typically resides between the file system and the data storage system to facilitate access of corresponding data stored in the data storage system. For example, the translation layer facilitates access to stored data via conversion of logical addresses to corresponding physical addresses indicating where data is stored in the data storage system.

As a specific example of storing data in a data storage system, a user of a computer system can generate a command to store a file in the data storage system. In response to receiving the command (such as from an application controlled by the user), the file system communicates with the translation layer associated with a data storage system in order to store the file. As discussed above, the translation layer facilitates logical-to-physical mapping of the file to storage cells in the data storage system.

To store the file, the file system first allocates a region for the new file in the logical address space between the file system and the translation layer. That allocation can be done inside the file system, and can be based on the current state of the file system and requested task.

The next step is for the file system to store the data associated with the file in the allocated region, which typically will result in multiple requests to the translation layer. The translation layer typically partitions the request into chunks of data and then stores the chunks of data in free storage cells in the data storage system. In some cases, the free storage cells are not physically located near each other. This forces the file system to store the chunks at different locations in the data storage system to accommodate storage of the data. The file system keeps track of where the chunks of data are stored in the logical address space between the file system and translation layer so that it is possible to reconstruct the original file at a later time when requested by a corresponding computer user. The translation layer keeps track of where the data located in the logical address space is physically located in the storage medium.

BRIEF DESCRIPTION OF THE DRAWINGS

The accompanying drawings, which are incorporated in and constitute a part of this specification, illustrate one or more embodiments described herein and, together with the Detailed Description, explain these embodiments.

DESCRIPTION OF THE EMBODIMENTS

Figure 1:
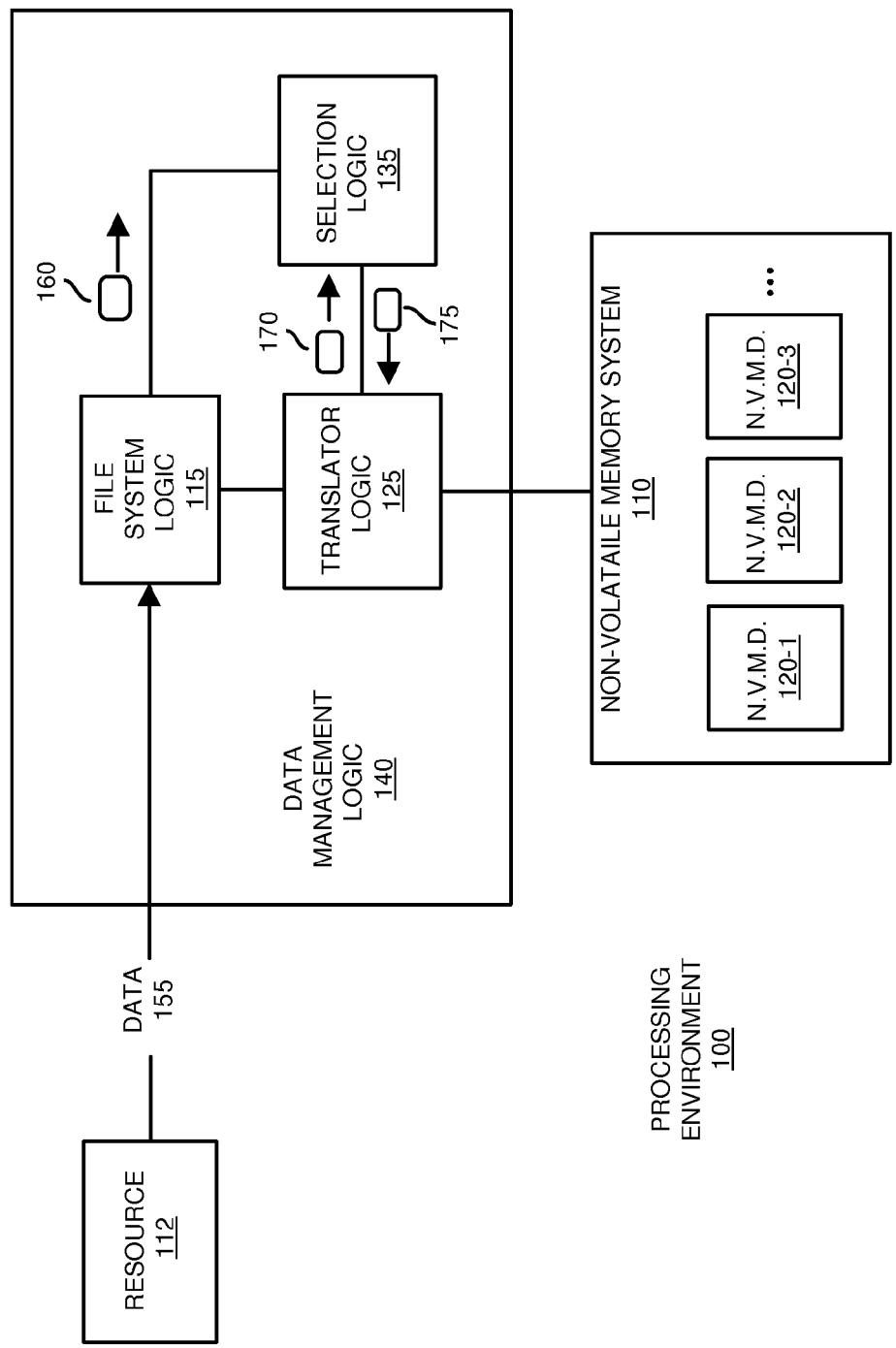
FIG. 1 is an example diagram illustrating processing and storage of received data in a data storage system according to embodiments herein.

This disclosure includes the observation that conventional methods of storing data in a corresponding solid-state drive are quite often inefficient. That is, conventional methods of storing data typically do not take into account the type of data being stored in the data storage system and therefore do not efficiently store data in a respective data storage system. In certain instances, the storage of data using conventional methods requires many extra storage operations, hindering a speed at which the corresponding content is stored in the data storage system.

More specifically, in contrast to conventional methods, embodiments herein include selection logic that facilitates more efficient storage of data in a corresponding nonvolatile memory system. For example, one embodiment herein includes selection logic. The selection logic is in communication with a file system and corresponding logical-to-physical translation layer. The logical-to-physical translation layer may be integrated as part of the file system.

In one embodiment, the selection logic is disposed to operate between the file system and the translation layer. Based on attributes of a file to be stored in the data storage system and current usage of stored cells in the data storage system, the selection logic facilitates more efficient storage of corresponding data in a respective data storage system.

More specifically, in one embodiment, assume that a file system receives a request to store data in a non-volatile memory system. Prior to storage of the file in the data storage system, the selection logic receives attributes associated with the file such as whether the corresponding file data (particular data) to be stored is metadata, application data, etc. In addition to receiving attribute information, the selection logic receives status information indicating present usage of storage cells in the non-volatile memory system. In one embodiment, the status information indicates used storage cells that currently store data and unused storage cells that are free to store data in the non-volatile memory system.

The selection logic analyzes the received attributes of the particular data to be stored in view of the present usage of storage cells. Depending on present usage of storage cells in the non-volatile memory system and the attributes of the particular data to be stored, the selection logic selects a mode amongst multiple possible storage modes in which to efficiently store the particular data in the non-volatile memory system.

In addition to selecting a storage mode, the selection logic also can be configured to allocate free storage cells in the non-volatile memory system to store the particular data. Thereafter, the selection logic initiates storage of the particular data in the non-volatile memory system. For example, in one embodiment, the selection logic communicates the selected mode as well as allocated storage cells to a translation layer or other suitable resource that facilitates storage of the data in the non-volatile memory system. The translation layer stores the data in the allocated storage cells in a manner as specified by the selected storage mode.

As discussed herein, different storage modes can be used to store different types of data. A first storage mode can be used to store a first type of data such as metadata. By way of non-limiting example, the first storage mode can include first storing the data in available storage cells and then moving data as needed to free up previously used storage cells. A second storage mode can be used to store a second type of data such as application data. By way of non-limiting example, the second storage mode can include first identifying data to be deleted and then storing the data in available storage cells. Thus, an ordering of storage operations can vary depending on the type of data to be stored and which storage cells are free to store the data.

As discussed herein, selecting and executing the appropriate storage mode for different types of data substantially increases a respective speed associated with storing data in a non-volatile memory system.

Now, more specifically, FIG. 1 is an example diagram illustrating processing and storage of received data in a data storage system according to embodiments herein.

As shown, processing environment 100 includes resource 112, data management logic 140, and non-volatile memory system 110 (e.g., a data storage system). As further shown, data management logic 140 includes file system logic 115, translator logic 125, and selection logic 135. The different resources such as file system logic 115, translator logic 125, selection logic 135, etc., can be interconnected via any suitable resource such as a bus, serial communication link, etc. Accordingly, resources in the data management logic 140 are able to communicate with each other.

Non-volatile memory system 110 can be any suitable type of data storage system. By way of non-limiting example, non-volatile memory system 110 can be a solid-state drive including one or more solid-state memory devices such as non-volatile memory device 120-1, non-volatile memory device 120-2, non-volatile memory device 120-3, etc., to store data.

Each of the non-volatile memory devices 120 in non-volatile memory system 110 can be any suitable type of non-volatile memory such as NAND flash memory, NOR flash memory, etc.

As discussed herein, the non-volatile memory in memory system 110 can require block erases in which multiple pages of storage cells in a respective block are simultaneously erased. Subsequent to erasing a block, data can be individually written to the pages in the erased block at different times.

Each of the resources (such as file system logic 115, translator logic 125, and selection logic 135) in data management logic 140 supports a different function to facilitate efficient storage of data 155 in non-volatile memory system 110. Depending on the embodiment, each of the resources can be hardware, software, firmware, or a combination of any of these types of resources.

As its name suggests, file system logic 115 manages storage of files (data) in non-volatile memory system 110. Among other storage functions, translator logic 125 facilitates translation of logical addresses to corresponding physical addresses where data is stored in the non-volatile memory system 110.

In general, to facilitate more efficient storage of data in non-volatile memory system 110, as shown, the selection logic 135 receives attribute information 160 from file system logic 115. As its name suggests, the attribute information 160 indicates attributes of the data 155 to be stored in the non-volatile memory system 110. Additionally, as mentioned the selection logic 135 receives status information 170 indicating present usage of storage cells in the non-volatile memory system 110. In one embodiment, based on the attribute information 160 and the status information 170, the selection logic 135 produces storage control information 175 indicating an appropriate mode to store the data in corresponding allocated storage cells of non-volatile memory system 110.

Figure 2:
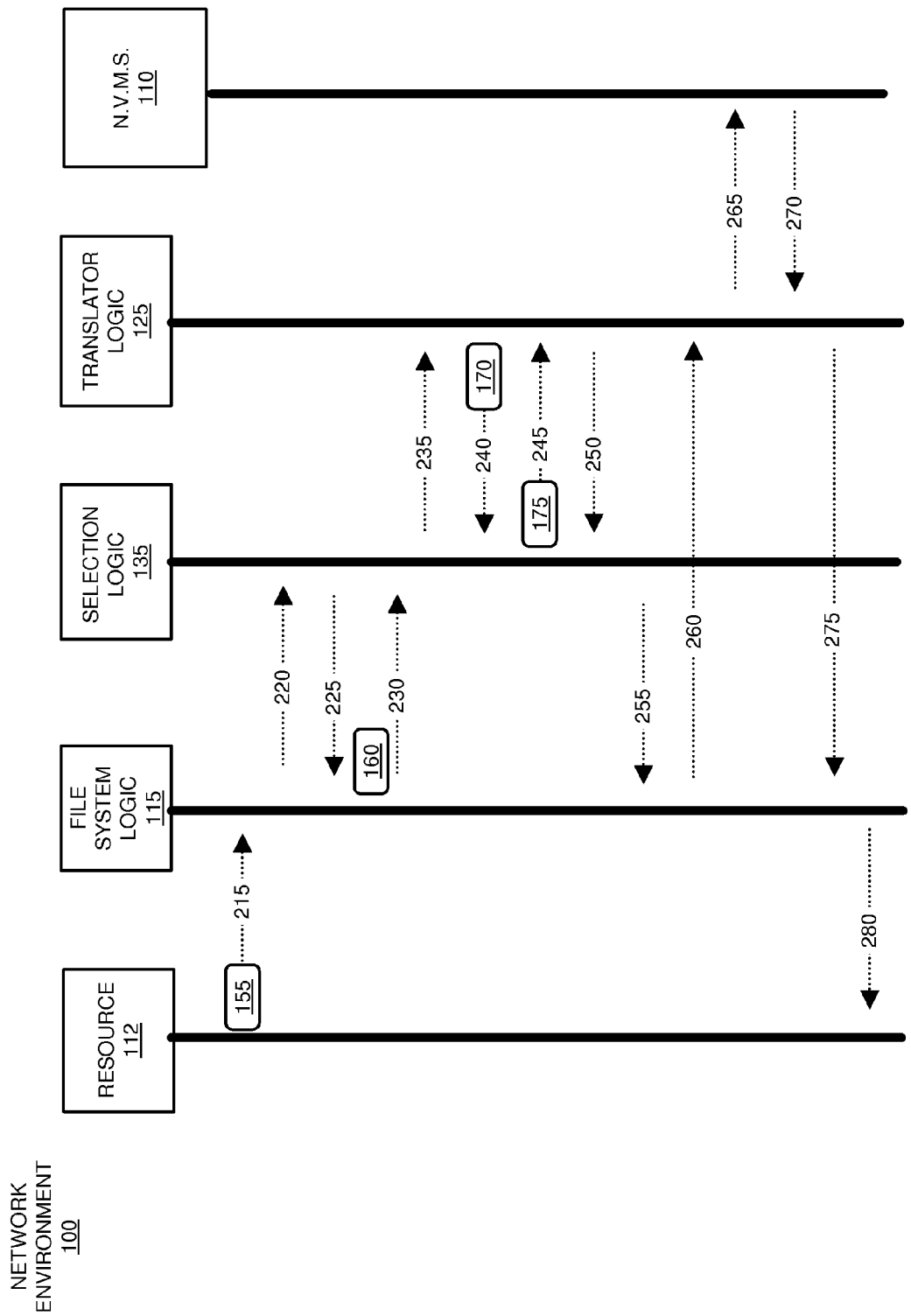
FIG. 2 is an example diagram illustrating the flow of communications associated with management and storage of data in a data storage system according to embodiments herein.

As further illustrated in FIG. 2, selection logic 135 provides a novel way of efficiently storing data in the non-volatile memory system 110 based on information such as attribute information 160 and status information 170.

For sake of further illustration, as shown in FIG. 2, via communications 215, the resource 112 provides data 155 to file system logic 115 for storage in non-volatile memory system 110. In one embodiment, the communications 215 include a command to store data 155 in non-volatile memory system 110. In one embodiment, the file system logic 115 receives data 155. Note again that resource 112 can be any suitable type of resource such as a user, an application executing on a computer system, computer generated data, metadata generated by file system logic 115 to manage corresponding data stored in the non-volatile memory system 110, etc.

In furtherance of storing data 155 in non-volatile memory system 110, via communications 220, file system logic 115 communicates a request for allocation of an appropriate sized group or cluster of storage cells in the non-volatile memory system 110 to store data 155.

In response to receiving the request for allocation of storage cells, via generation of communications 225, the selection logic 135 notifies file system logic 115 to provide attribute information 160 associated with the data 155 to be stored in non-volatile memory system 110.

By way of non-limiting example, as mentioned, attribute information 160 can indicate the type associated with data 155 such as whether the data 155 is application data, metadata, etc. Additionally or alternatively, the attribute information 160 can indicate other possible information such as a size of the file (amount of bytes associated with data 155) to be stored, a formatting of the data 155 to be stored, offset information indicating where data 155 is to be inserted in a segment of file currently stored in the non-volatile memory system 110, etc.

In response to receiving the request for attribute information 160, the file system logic 115 initiates communication of attribute information 160 to selection logic 135 via communications 230. Based at least in part on receipt of the attribute information 160 associated with data 155, the selection logic 135 can determine how best to efficiently store the data 155.

In furtherance of storing data 155 in non-volatile memory system 110, via communications 235 to translator logic 125, the selection logic 135 requests status information 170 indicating present usage of storage cells in the non-volatile memory system 110.

In response to receiving communications 235 from selection logic 135, translator logic 125 communicates status information 170 via communications 240 to selection logic 135. In this way, the translator logic 125 notifies selection logic 135 of available and unavailable storage cells in non-volatile memory system 110.

In one embodiment, the status information 170 (or present usage information) indicates used storage cells in non-volatile memory system 110 that currently store data. The status information 170 or present usage information also can indicate unused storage cells in non-volatile memory system 110 that are free to store data.

Additionally, the status information 170 can include further information indicating different groupings or regions of storage cells in the non-volatile memory system 110 that store or are configured to store different types of data. For example, in one embodiment, the status information 170 can indicate that: a first set of one or more regions of storage cells in non-volatile memory system 110 currently stores or has been assigned to store a first type of data; a second set of one or more regions of storage cells in non-volatile memory system 110 currently stores or has been assigned to store a second type of data; and so on.

As previously discussed, the non-volatile memory system 110 can include non-volatile memory device 120-1, non-volatile memory device 120-2, non-volatile memory device 120-3, etc. Each non-volatile memory device in non-volatile memory system 110 can include multiple blocks of storage cells. Each block can include multiple pages of storage cells for storage of corresponding data.

To store data, a corresponding block including multiple pages is initially erased. Thereafter, data can be written to the pages in the block on an as-needed basis. Subsequent to writing data to a respective page in the corresponding block, the whole block of pages including the respective page must be erased again in order to write new data to the respective page. Thus, ERASES can occur at the block level; WRITES occur at the page level after an initial erase.

By further way of non-limiting example, the status information 170 provided by the translator logic 125 can be configured to notify selection logic 135 of information such as which pages and/or blocks in the non-volatile memory system 110 are erased and available for storage of corresponding data, which pages and/or blocks in the non-volatile memory system 110 currently store valid data that must not be erased, which pages and/or blocks in the non-volatile memory system 110 store invalid data that can be erased, which pages and/or blocks in the non-volatile memory system 110 store valid data that can be moved, which different regions of storage cells in the non-volatile memory system 110 are used to store different types of data, etc.

The selection logic 135 analyzes the received attribute information 160 of the particular data 155 to be stored in non-volatile memory system 110 in view of the present usage of storage cells as indicated by corresponding status information 170. Depending on present usage of storage cells in the non-volatile memory system 110 and the attributes of the particular data 155 to be stored, the selection logic 135 allocates storage cells in which to store the data 155. In one embodiment, the selection logic 135 allocates a free set of storage cells in the non-volatile memory system 110 that are most suited to store the particular data 155. This may include selection of a region of storage cells in the non-volatile memory system 110 that currently store the same or similar type of data as the particular data 155. For example, metadata can be stored with metadata, application data can be stored with application data, and so on. In addition to selecting a region of storage cells in the non-volatile memory system 110 to store particular data 155, the selection logic 135 also selects a mode amongst multiple possible storage modes in which to store the particular data 155 in the non-volatile memory system 110.

Thereafter, via communications 245, the selection logic 135 initiates storage of the particular data 155 in the non-volatile memory system 110. For example, via communications 245, the selection logic 135 transmits data storage control information 175 to notify translator logic 125 which of one or more storage cells in the non-volatile memory system 110 have been allocated to store corresponding data 155. Additionally, via the transmitted data storage control information 175, the selection logic 135 notifies translator logic 125 of the selected mode amongst multiple possible storage modes to be used when storing data 155.

Via communications 250, the selection logic 135 receives an acknowledgment from translator logic 125 that translator logic 125 received the data storage control information 175.

The selection logic 135 generates communications 255 to file system logic 115. Via communications 255, the selection logic 135 notifies file system logic 115 that a new cluster of storage cells in the non-volatile memory system 110 has been allocated and a storage mode has been selected to store data 155.

In furtherance of storing data 155 in non-volatile memory system, via communications 260, file system logic 115 communicates with translator logic 125 to initiate storage of data 155 in allocated storage cells of the non-volatile memory system 110 using the selected storage mode as specified by the data storage control information 175.

Via communications 265 and 270, the translator logic 125 stores data 155 in non-volatile memory system 110. This can include partitioning data 155 into appropriate segments, and then storing the segments in the allocated storage cells of non-volatile memory system 110 using the selected storage mode as specified by control information 175. Possible ways of storing the data 155 are more particularly shown in FIGS. 3 through 6.

Referring again to FIG. 2, subsequent to storage of data 155, the translator logic 125 sends an acknowledgment message via communications 275 to file system logic 115 to indicate that the data 155 has been stored in non-volatile memory system 110.

File system logic 115 generates communications 280 to resource 112 to indicate that the data 155 was successfully stored in non-volatile memory system 110. Accordingly, selection logic 135 facilitates storage of corresponding data in non-volatile memory system.

As mentioned, the following FIGS. 3 through 6 illustrate different possible modes in which to store received data. As discussed below in more detail, a first storage mode can be used to more efficiently store a first type of data such as metadata. Use of the first storage mode may be less efficient when storing application data. A second storage mode can be used to more efficiently store a second type of data such as application data. Use of the second storage mode may be less efficient when storing metadata.

Figure 3:
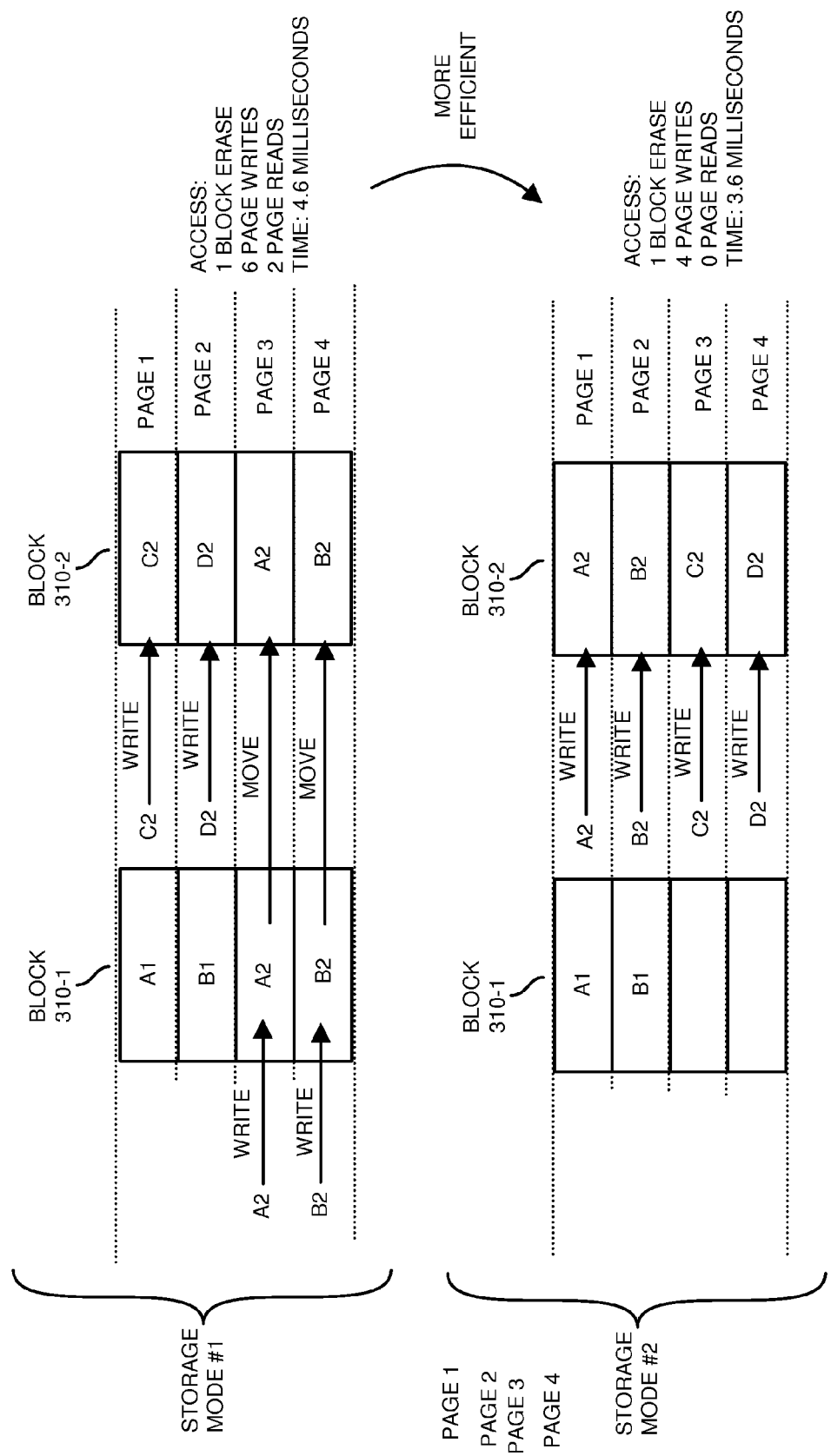
FIG. 3 is an example diagram illustrating use of different modes for storing data in allocated storage cells according to embodiments herein.

FIG. 3 is an example diagram illustrating use of different modes for storing data in allocated storage cells according to embodiments herein.

As shown, embodiments herein include at least a storage mode #1 and storage mode #2 to store data. However, any number of multiple storage modes can be selected to store corresponding data.

In this example embodiment, selection logic 135 selects storage mode #1 to store data if the corresponding data is metadata. Selection logic 135 selects storage mode #2 to store data if the corresponding data is application type data.

As previously discussed, in one non-limiting example embodiment, the selection logic 135 selects a mode to store data depending on status information 170 and attribute information 160. Recall that attribute information 160 indicates the type associated with data 155 to be stored.

Assume in this example embodiment that, prior to storage of data 155, status information 170 indicates that: page 1 of block 310-1 stores segment A1, page 2 of block 310-1 stores segment B1, page 3 of block 310-1 is free to store data, page 4 of block 310-1 is free to store data, page 1 of block 310-2 is free to store data, page 2 of block 310-2 is free to store data, page 3 of block 310-2 is free to store data, and page 4 of block 310-2 is free to store data. As previously discussed, the status information 170 also can indicate regions of stored cells in the non-volatile memory system 110 that store different types of data. For efficiency reasons, it may be desirable to store: a first type of data such as metadata in a first region of storage cells in the non-volatile memory system 110; a second type of data such as application data and a second region of stored cells in the non-volatile memory system 110; and so on.

Assume in this example embodiment, that data 155 includes segments A2, B2, C2, and D2 for storage in non-volatile memory system 110. Segment of data A2 is a replacement or update for segment of data A1, segment of data B2 is a replacement or update for segment of data B1. Attribute information 160 can indicate whether or which portions of data 155 are replacements for corresponding data already stored in non-volatile memory system 110.

In one embodiment, assume that segments A2, B2, C2, and D2, are application data such as frames or portions of streaming content for playback on a corresponding media player, portions of the file, etc.

Selection logic 135 selects between storage mode #1 and storage mode #2 to store corresponding data 155 in non-volatile memory system 110. The type associated with data 155 and present usage of storage cells in non-volatile memory system 110 dictates which of the storage modes is best (e.g., most efficient) to store corresponding data 155.

Assume that the status information 170 (associated with storage of segments A2, B2, C2, and D2) indicates that region of storage cells including those in block 310-1 and block 310-2 are currently used to store application data such as segment A1 and segment A2. In furtherance of storing similar types of data in the same region of non-volatile memory system 110, in one embodiment, the selection logic 135 allocates free storage cells in block 310-1 and block 310-2 to store corresponding segments A2, B2, C2, and D2 because it is application data.

The following illustration of the different modes indicates how storage mode #2 is substantially better for storing certain type of data (such as application data) than storage mode #1 (which is useful to store metadata).

Storage Mode #1

Assume in this example that the selection logic 135 produces data storage control information 175 indicating use of storage mode #1 to store corresponding data 155 in free pages 3 and 4 in block 310-1 and pages 1 through 4 in block 310-2 of non-volatile memory system 110.

In accordance with the storage mode #1 (which stores data first and then performs a cleanup by moving data) when storing data, the translator logic 125 first stores segment A2 in page 3 of block 310-1 as shown. Thereafter, the translator logic 125 stores segment B2 in page 4 of block 310-1. Because no more pages are available, translator logic 125 stores segment C2 in page 1 of block 310-2, and segment D2 in page 2 of block 310-2. This completes storage of data 155 in non-volatile memory system 110.

However, in addition to storing data in free pages, storage mode #1 performs a data cleanup operation subsequent to completing storage of segments A2, B2, C2 and D2. For example, as shown, to free storage cells in block 310-1, storage mode #1 initiates (via copying) moving segment A2 in page 3 of block 310-1 to page 3 of block 310-2. Additionally, the translator logic 125 initiates (via copying) moving of segment B2 in page 4 of block 310-1 to page 4 of block 310-2. The storage mode #1 then erases block 310-1 to free storage cells therein for storage of other data.

This example of storing segments A2, B2, C2, and D2 via the storage mode #1 in the non-volatile memory system includes 1 block erase, 6 page WRITES, 2 page READS. As an example, this may require 4.6 milliseconds to perform the corresponding storage function.

Storage Mode #2

Assume in this example that, as an alternative to selecting storage mode #1, the selection logic 135 produces data storage control information 175 indicating use of storage mode #2 to store corresponding data 155 in free pages 3 and 4 in block 310-1 and pages 1 through 4 in block 310-2 of non-volatile memory system 110.

For sake of illustration, and as shown in bottom portion of FIG. 3, storage mode #2 includes managing currently stored data and then storing the corresponding data 155 to allocated storage cells in the non-volatile memory system 110.

For example, as shown, because it is known to selection logic 135 that segment A2 is written followed by B2, C2 and D2, selection logic 135 selects storage mode #2. Selection logic 135 notifies translator logic 125 to use storage mode #2 to store segments A2, B2, C2 and D2. In accordance with the selected storage mode, the translator logic 125 initiates storage of segment A2 (via a WRITE) to page 1 of block 310-2 (instead of page 3 of block 310-1 as in storage mode #1), storage of segment B2 in page 2 of block 310-2, storage of segment C2 to page 3 of block 310-2, and storage of segment D2 to page 4 of block 310-2. There is no need to move segments A1 and B1 because they are now replaced by segments A2 and B2.

As indicated, this process of storing segments A2, B2, C2, and D2 via the storage mode #2 in the non-volatile memory system 110 includes 1 block ERASE, 4 page WRITES, and 0 page READS. This hypothetically requires 3.6 milliseconds of time to perform the corresponding storage function.

This example illustrates that storage mode #1 is a first manner in which to carry out writing of the new data (such segments A2, B2, C2, and D2) and managing (such as erasing) the old data (segments A1 and B1) stored in the non-volatile memory system compared to storage mode #2, which specifies a second manner in which to carry out writing of the new data and managing the old data (A1 and B2) stored in the non-volatile memory system 110.

This example also illustrates that storage mode #1 is substantially less efficient when storing data in non-volatile memory system 110 compared to the efficiency of storing corresponding data using storage mode #2. In other words, when generating corresponding data storage control information 175 for storage of data 155 in non-volatile memory system 110, the selection logic 135 selects storage mode #2 to store a respective file including segments A2, B2, C2, and D2 because it is more efficient than storage mode #1. In one embodiment, as previously discussed, the selection logic 135 selects storage mode #2 in response to detecting that data 155 is a particular type of data.

In one embodiment, the attribute information 160 associated with the new data (segments A2, B2, C2, and D2) indicates that the new data 155 to be stored in non-volatile memory system 110 is application data. In response to detecting that the new data (segments A2, B2, C2, and D2) to be stored is application data, the selection logic 135 selects storage mode #2 to store the new data in the non-volatile memory system 110. As shown and as previously discussed, the storage mode #2 initiates writing of the new data (segments A2, B2, C2, and D2) in a new block such as block 310-2 of the non-volatile memory system 110 as opposed to writing a portion of data to block 310-1 that stores old data (segments A1 and B1).

Assume that via the data storage control information 175, the selection logic 135 notifies translator logic 125 to store data 155 in block 310-2 using storage mode #2. In such an instance, to carry out storage of the data 155 (segments A2, B2, C2, and D2) in the non-volatile memory system 110, the translator logic 125 partitions the data 155 into multiple segments A2, B2, C2, and D2. In one embodiment, none of the segments A2, B2, C2, and D2 are replacement data to each other. The translator logic 125 then identifies a set of blocks (i.e., one a more blocks such as block 310-2) in the non-volatile memory system 110 that are allocated to store the data 155. The translator logic 125 then stores the corresponding data 155 via storage mode #2 as shown in FIG. 3.

Accordingly, the particular data (segments A2 and B2) can be an updated version of current data (segments A1 and B1) in block 310-1. When initiating storage of segments A2 and B2, storage mode #2 initiates storage of these segments in respective pages 1 and 2 of block 310-2 of the non-volatile memory system 110. In accordance with the storage mode #2, via status information 170, the selection logic 135 identifies block 310-1 and block 310-2 as including free pages of storage cells to store data. In accordance with storage mode #2, the translator logic 125 stores the data 155 in block 310-2 even though block 310-1 includes sufficient capacity of free storage cells to store the data 155.

In addition to being a more efficient manner of storing data 155 (e.g., segments A2, B2, C2, and D2), the selection of storage mode #2 reduces the amount of garbage collection operations that needs to be performed at a later time. In general, conventional garbage collection includes identifying blocks in the memory system that include stale pages of data (i.e., pages of data that can be deleted because they are no longer needed). Stale pages of data are typically mixed amongst non-stale pages of data (i.e., data that is to be available for later use). In accordance with garbage collection, to reduce an amount of used storage cells, the non-stale data in the original block is rewritten (moved) to pages in another erased block. Subsequent to moving data, the original block including the stale pages can then be erased, freeing up the pages in the original block. In the present example, because storage of data 155 in block 310-2 includes recognizing that segments A1 and B1 are old data, and that the storage mode #2 includes erasing block 310-1, there is no need to implement a garbage collection operation at a later time to delete segments A1 and B1.

Figure 4:
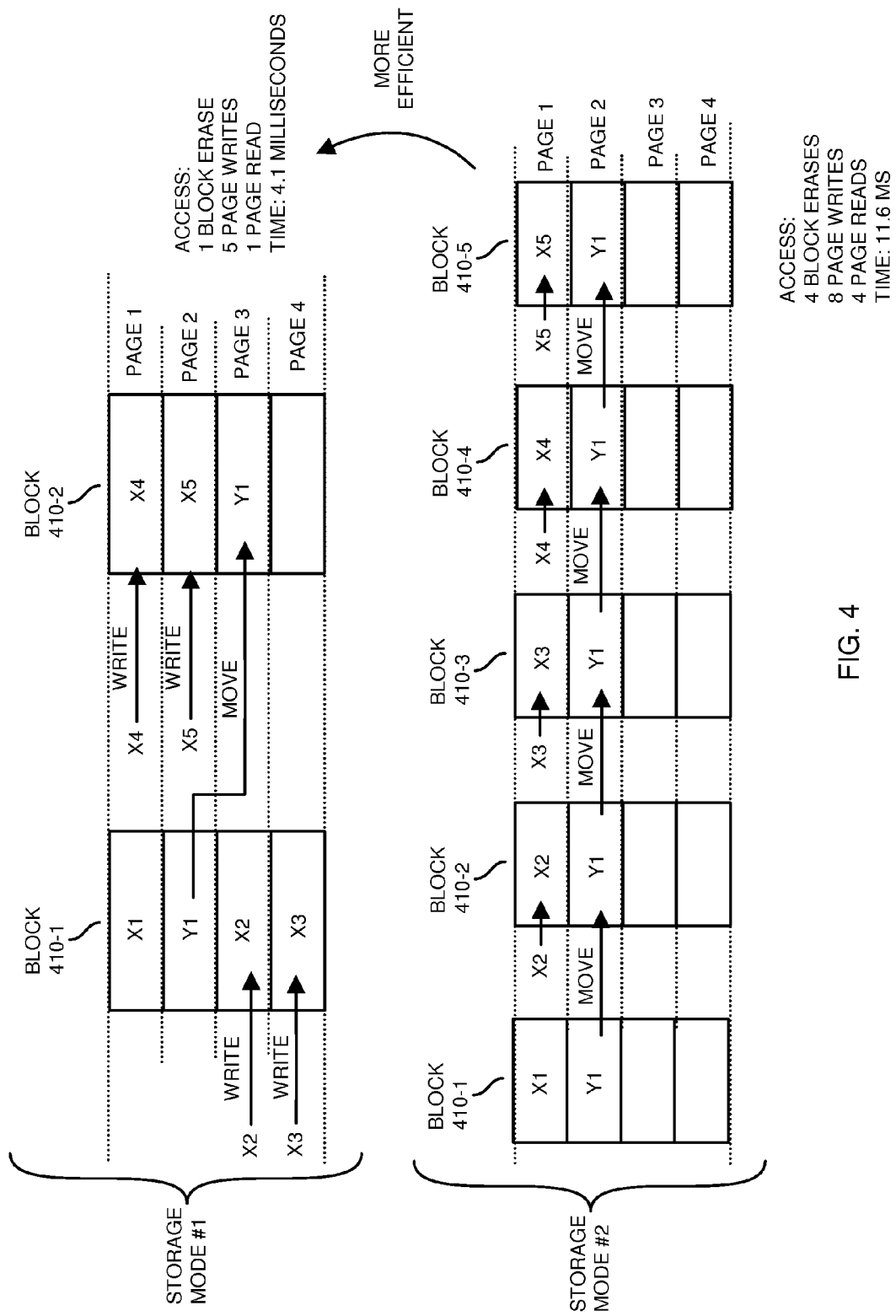
FIG. 4 is an example diagram illustrating storage of data in allocated storage cells using different storage modes according to embodiments herein.

FIG. 4 is an example diagram illustrating use of different storage modes according to embodiments herein.

Assume in this example that data 155 includes segments X2, X3, X4, and X5. As previously discussed, in one non-limiting example embodiment, the selection logic 135 selects a mode to store data depending on corresponding status information 170 and attribute information 160. Recall that attribute information 160 indicates the type or attributes associated with data 155 to be stored.

Assume in this example embodiment that, prior to storage of data 155, status information 170 indicates that: page 1 of block 410-1 stores segment X1, page 2 of block 410-1 stores segment Y1, page 3 of block 410-1 is free to store data, page 4 of block 410-1 is free to store data, page 1 of block 410-2 is free to store data, page 2 of block 410-2 is free to store data, page 3 of block 410-2 is free to store data, and page 4 of block 410-2 is free to store data.

Assume further in this example embodiment, that data 155 includes segments X2, X3, X4, and X5 for storage in non-volatile memory system 110. Segment X2 is a replacement or update for segment X1; segment X3 is a replacement or update for segment X2; segment X4 is a replacement for X3; X5 is a replacement or update for segment X4.

In one embodiment, segments X1, X2, X3, X4, and X5 represent metadata. Corresponding attribute information 160 associated with data 155 can indicate that data 155 is metadata constantly updated over time. In other words, the attribute information 160 associated with data 155 may indicate that data 155 is quite often updated and rewritten to non-volatile memory system 110 as a replacement to old data stored in non-volatile memory system 110. By way of non-limiting example, attribute information 160 can indicate that segments X2 is a replacement for segment X1, segment X3 is a replacement for segment X2, and so on.

Assume that the status information 170 indicates that region of storage cells including those in block 410-1 and block 410-2 are currently used to store metadata such as segment X1 and segment Y1. In furtherance of storing similar types of data in the same region of non-volatile memory system 110, in one embodiment, the selection logic 135 allocates block 410-1 and block 410-2 to store corresponding segments X1, X2, X3, X4, and X5 because it is metadata.

Selection logic 135 selects between storage mode #1 and storage mode #2 to store corresponding data 155 in non-volatile memory system 110. The following illustration of the different modes indicates how storage mode #2 is substantially better for storing certain type of data (such as metadata) than storage mode #1 (which is useful to store application data as previously discussed).

Storage Mode #1

Assume in this example that the selection logic 135 produces data storage control information 175 indicating use of storage mode #1 to store corresponding data 155 (e.g., segments X2, X3, X4, and X5) in free pages 3 and 4 in block 410-1 and pages 1 through 4 in block 410-2 of non-volatile memory system 110.

In accordance with the storage mode #1, when storing respective data 155 as specified by data storage control information 175, the translator logic 125 first stores segment X2 in page 3 of block 410-1 as shown. Thereafter, the translator logic 125 stores segment X3 in page 4 of block 410-1. Because no more pages are available, translator logic 125 then stores segment X4 in page 1 of block 410-2, and segment X5 in page 2 of block 410-2. This completes storage of new data 155 (i.e., segments X2, X3, X4, and X5) in corresponding blocks 410-1 and 410-2 in non-volatile memory system 110.

However, in addition to storing data in allocated free pages, storage mode #1 performs a cleanup procedure subsequent to completing storage of segments X1, X2, X3, X4, and X5. For example, as shown, to free storage cells in block 410-1, storage mode #1 initiates (via copying) moving segment Y1 in page 2 of block 410-1 to page 3 of block 410-2. The storage mode #1 then erases block 410-1 to free storage cells therein for storage of other data.

This example of storing segments X2, X3, X4, and X5 via the storage mode #1 in the non-volatile memory system includes 1 block erase, 5 page WRITES, and 1 page READ.

This hypothetically requires 4.1 milliseconds of time to perform the corresponding storage function.

Storage Mode #2

Assume in this example that, as an alternative to selecting storage mode #1, the selection logic 135 produces data storage control information 175 indicating use of storage mode #2 to store corresponding data 155 (e.g., segments X2, X3, X4, and X5) in free pages of blocks 410-2, 410-3, 410-4, and 410-5 of non-volatile memory system 110. For sake of illustration, and as shown in bottom portion of FIG. 4, storage mode #2 includes storing portions of new data 155 in different blocks as well as moving old data from block to block.

For example, as shown, because segment X2 is a replacement for segment X1, storage mode #2 as executed by translator logic 125 writes segment X2 to page 1 of block 410-2. The storage mode #2 then READs segment Y1 from page 2 of block 410-1 and then moves segment Y1 into page 2 of block 410-2. Storage mode #2 then erases pages in block 410-1.

Because segment X3 is a replacement for segment X2, storage mode #2 writes segment X3 to page 1 of block 410-3. The storage mode #2 then READs segment Y1 from page 2 of block 410-2 and then moves segment Y1 into page 2 of block 410-3. Storage mode #2 then erases pages in block 410-2.

Because segment X4 is a replacement for segment X3, storage mode #2 writes segment X4 to page 1 of block 410-4. The storage mode #2 then READs segment Y1 from page 2 of block 410-3 and then moves segment Y1 into page 2 of block 410-4. Storage mode #2 then erases pages in block 410-3.

Because segment X5 is a replacement for segment X4, storage mode #2 writes segment X5 to page 1 of block 410-5. The storage mode #2 then READs segment Y1 from page 2 of block 410-4 and then moves segment Y1 into page 2 of block 410-5. Storage mode #2 then erases pages in block 410-4.

As indicated, this process of storing segments X2, X3, X4, and X5 via the storage mode #2 in the non-volatile memory system 110 includes 4 block ERASEs, 8 page WRITES, and 4 page READS. This hypothetically requires 11.6 milliseconds of time to perform the corresponding storage function.

This example illustrates that storage mode #1 to store data 155 (such as segment's X2, X3, X4, and X5) is substantially more efficient when storing data X in non-volatile memory system 110 compared to the efficiency of storing corresponding data X using storage mode #2. In other words, the selection logic 135 selects storage mode #1 to store a respective file including segments X2, X3, X4, and X5 because it is more efficient than storage mode #2.

During the decision-making process, in response to detecting that the data 155 to be stored in the non-volatile memory system 110 is data that is constantly updated (such as metadata generated to manage storage of corresponding application data in the non-volatile memory system), the selection logic 135 selects the storage mode #1 to write the data 155 in the non-volatile memory system 110. In accordance with storage mode #1, the translator logic 125 can be configured to more efficiently write the data X2, X3, X4, and X5 to allocated blocks in the non-volatile memory system 110 prior to moving the old data (such as segment Y1) previously stored in the non-volatile memory system 110.

Figure 5:
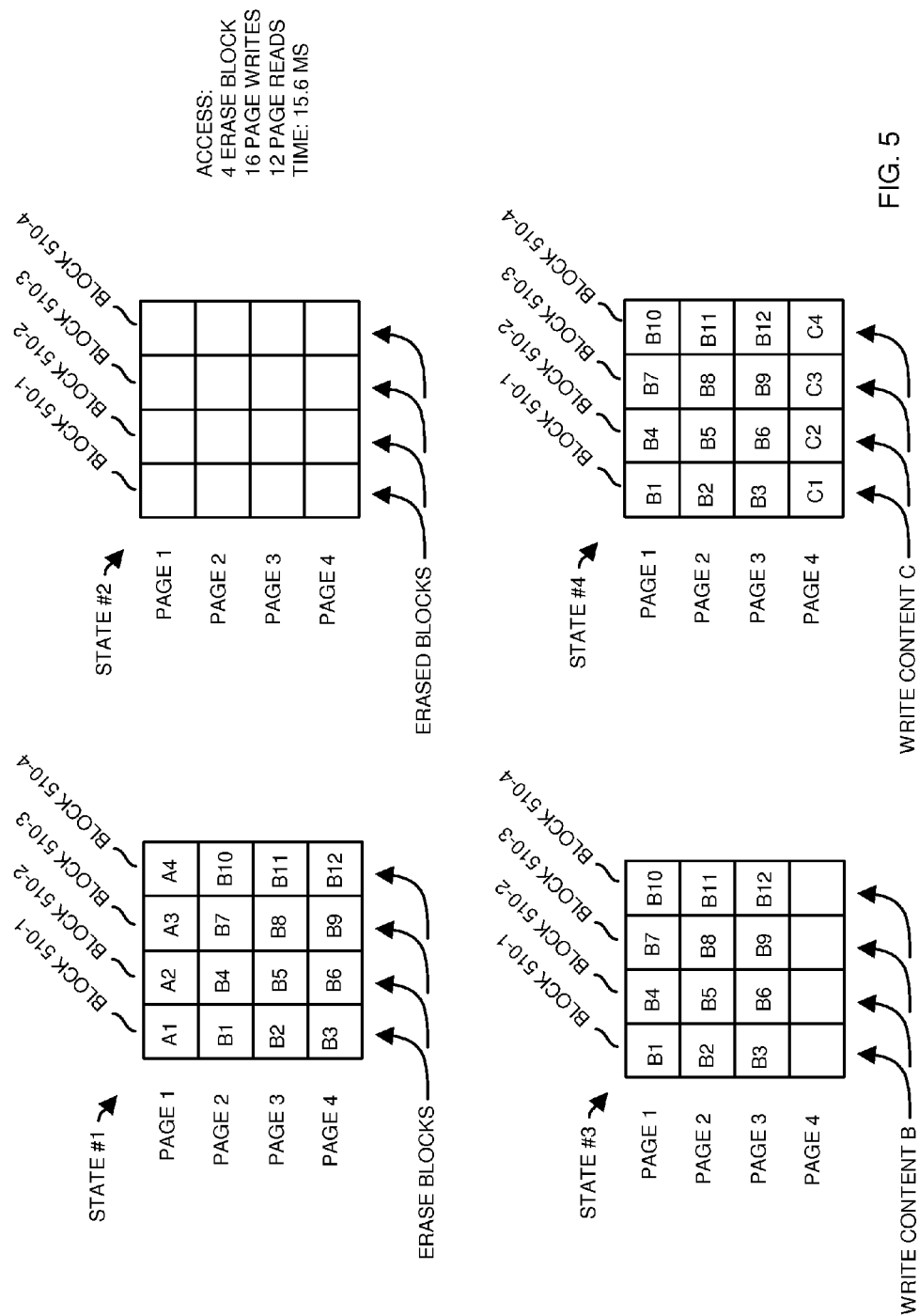
FIG. 5 is an example diagram illustrating storage of data in allocated storage cells in accordance with a first storage mode according to embodiments herein.

FIG. 5 is an example diagram illustrating storage of data in accordance with a storage mode according to embodiments herein.

The following example illustrates how WRITE performance may be negatively impacted if cluster allocation for storage of data is not within a column of physical flash blocks of a non-volatile memory device for certain types of data.

As shown, assume that non-volatile memory system 110 includes block 510-1, block 510-2, block 510-3, and block 510-4 to store corresponding data.

In one embodiment, block 510-1 resides in non-volatile memory device 120-1; block 510-2 resides in non-volatile memory device 120-2; block 510-3 resides in non-volatile memory device 120-3; and so on. Alternatively, each of blocks 510-1, 510-2, 510-3, and 510-4 can be located in the same non-volatile memory device.

As previously discussed, each of the blocks can include multiple pages of storage cells.

As shown in state #1, assume that content A (including a sequence of logical segments A1, A2, A3, and A4, none of which are replacement data to each other) are stored in corresponding pages across multiple blocks. For example, as shown, segment A1 is stored in page 1 of block 510-1, segment A2 is stored in page 1 of block 510-2, segment A3 is stored in page 1 of block 510-3, and segment A4 is stored in page 1 of block 510-4.

Content B in this example includes segments B1, B2, B3, B4, B5, B6, B7, B8, B9, B10, B11, and B12, which are stored in corresponding pages of blocks 510-1, 510-2, 510-3, 510-4. For example, segment B1 is stored in page 2 of block 510-1, segment B2 is stored in page 3 of block 510-1, segment B3 is stored in page 4 of block 510-1, segment B4 is stored in page 2 of block 510-2, segment B5 is stored in page 3 of block 510-2, and so on. Note that content B also can be a sequence of logical segments B1, B2, B3, . . . B12, none of which are replacement data to each other.

Assume that the data 155 to be stored in non-volatile memory system 110 includes content C such as segments C1, C2, C3, and C4 (in which none of the segments are replacement data to each other) to replace content A (including segments A1, A2, A3, and A4).

In a manner as previously discussed, the selection logic 135 selects a mode in which to store content C in the non-volatile memory system 110. For sake of illustration, assume that the selection logic 135 selects the storage mode as illustrated in FIG. 5 to store corresponding content C. As mentioned above, this example illustrates that execution of the storage mode as illustrated in FIG. 5 is not desirable for storing content C. Additionally, storage of segments of content A in different blocks as shown is undesirable.

To store content C, in state #2, the selected storage mode initially erases all storage cells in block 510-1, block 510-2, block 510-3, and block 510-4.

Thereafter, in state #3, the selected storage mode of FIG. 5 initiates writing segment B1 to page 1 of block 510-1, segment B2 to page 2 of block 510-1, segment B3 to page 3 of block 510-1, segment B4 to page 1 of block 510-2, segment B5 to page 2 of block 510-2, and so on.

Finally, in state #4, to complete storage of content C, the selected storage mode in FIG. 5 initiates storage of segment C1 in page 4 of block 510-1, storage of segment C2 in page 4 of block 510-2, storage of segment C3 in page 4 of block 510-3, and storage of segment C4 in page 4 of block 510-4.

Storage of content C using the storage mode as illustrated in FIG. 5 hypothetically requires 15.6 milliseconds of time.

Figure 6:
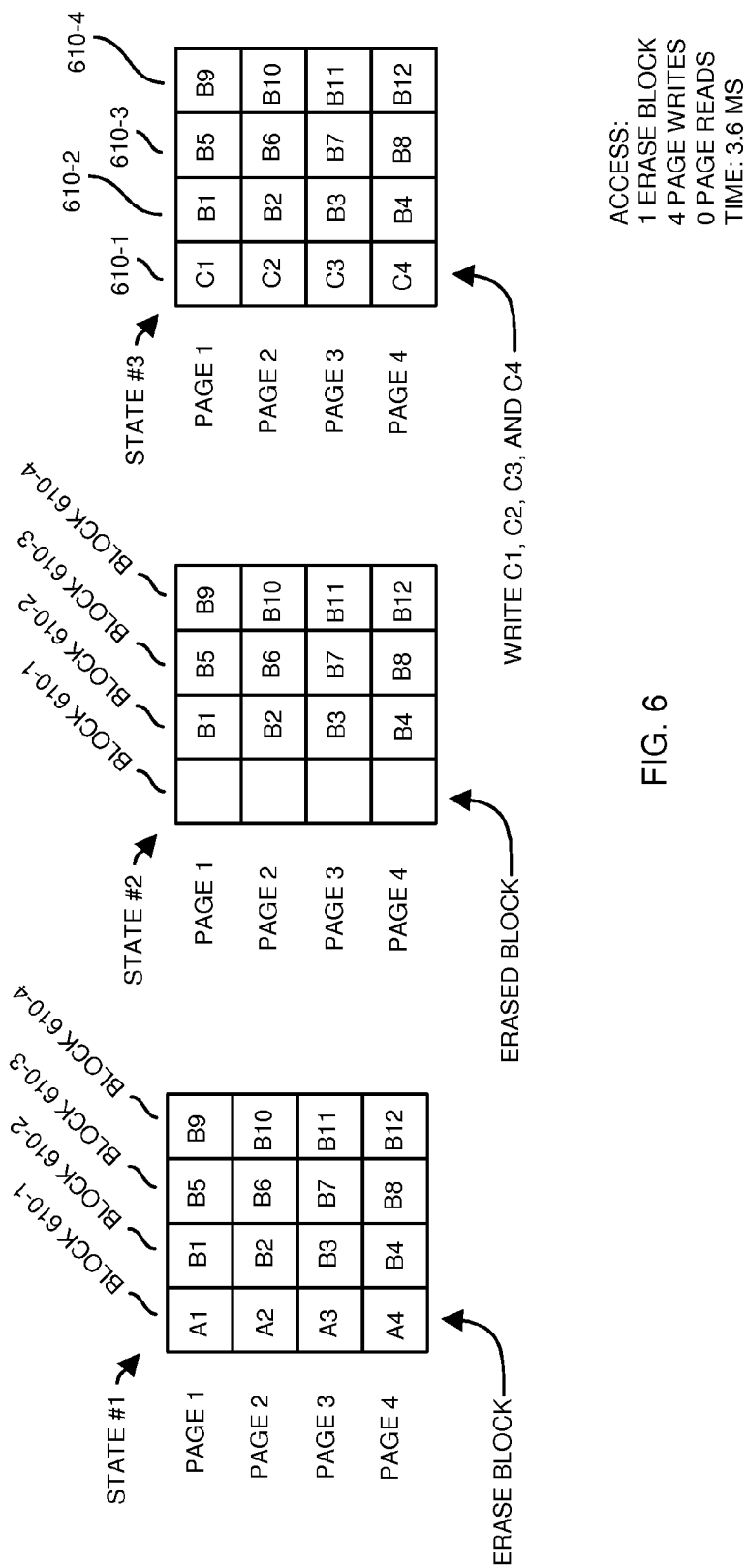
FIG. 6 is an example diagram illustrating storage of data in allocated storage cells in accordance with a second storage mode according to embodiments herein.

FIG. 6 below illustrates how use of another storage mode is substantially faster to store corresponding content C according to embodiments herein.

The following example illustrates how to enhance WRITE performance via allocation of columns of physical flash blocks to store sequences of related data.

As shown, assume that non-volatile memory system 110 includes block 610-1, block 610-2, block 610-3, and block 610-4 to store corresponding data. As previously discussed, each of the blocks can include multiple pages of storage cells to store the data.

In one embodiment, block 610-1 resides in non-volatile memory device 120-1; block 610-2 resides in non-volatile memory device 120-2; block 610-3 resides in non-volatile memory device 120-3; and so on. Alternatively, each of blocks 610-1, 610-2, 610-3, and 610-4 can be located in the same non-volatile memory device.

As shown in state #1, assume that content A (including segments A1, A2, A3, and A4) are stored in corresponding pages (e.g., page 1, page 2, page 3, and page 4) of block 610-1. In one embodiment, content A includes a sequence of logical segments A1, A2, A3, and A4, none of which are replacement data to each other) are stored in corresponding pages across multiple blocks.

As further shown in state #1, content B including segments B1, B2, B3, B4, B5, B6, B7, B8, B9, B10, B11, and B12, are stored in corresponding pages of blocks 610-2, 610-3, and 610-4. Note that content B also can be a sequence of logical segments B1, B2, B3, . . . B12, none of which are replacement data to each other.

Assume that the data 155 to be stored in non-volatile memory system 110 includes content C such as segment C1, C2, C3, and C4 to replace content A (including segments A1, A2, A3, and A4) stored in block 610-1. Note that content C also can be a sequence of logical segments C1, C2, C3, and C4, none of which are replacement data to each other.

FIGS. 5 and 6 illustrate that inefficient selection of allocation of clusters when writing content A (including segments A1, A2, A3, and A4) and content B (including segments B1, B2, B3, . . . ) may be important for the overall performance of the system. In one example embodiment, performance of the file system when writing content A and content B is equal no matter if the storage layout in FIG. 5 or in FIG. 6 is selected. However, later updates of data stored to the file system may be heavily impacted when using the layout in FIG. 6 as opposed to the layout in FIG. 5.

For sake of illustration, assume that the selection logic 135 selects the storage mode as illustrated in FIG. 6 to store corresponding content C (including segments C1, C2, C3, and C4). As mentioned above, this example illustrates that execution of the storage mode as illustrated in FIG. 6 is desirable for storing content C.

To store content C, in state #2, the storage mode illustrated in FIG. 6 erases all pages in block 610-1.

Thereafter, in state #3, the storage mode (as executed by a resource such as translator logic 125 or data management logic 140 in FIG. 6) initiates writing segment C1 to page 1 of block 610-1, segment C2 to page 2 of block 610-1, segment C3 to page 3 of block 610-1, and segment C4 to page 4 of block 610-1.

This example illustrates that storage of segments of related data in the same block and that the storage mode in FIG. 6 is substantially more efficient at storing content C in non-volatile memory system 110 than the storage mode in FIG. 5. For example, storage of content C using the storage mode in FIG. 5 may require 15.6 milliseconds to store corresponding data in non-volatile memory system 110 compared to 3.6 milliseconds when using the storage mode illustrated in FIG. 6. Thus, when corresponding attribute information associated with data to be stored in the non-volatile memory system 110 indicates that the data (such as content A, B, or C) to be stored is application data, the selection logic 135 selects storage mode in FIG. 6 to store corresponding data instead of choosing the storage mode as shown in FIG. 5.

Additionally, when initially storing content A and content B, the selection logic 135 can be configured to initiate storage of related segments of content in a same block of non-volatile memory system 110. As discussed above, storage of related data in the same block makes it very easy to erase the block and then rewrite new data over the old data as illustrated in the storage mode of FIG. 6.

Figure 7:
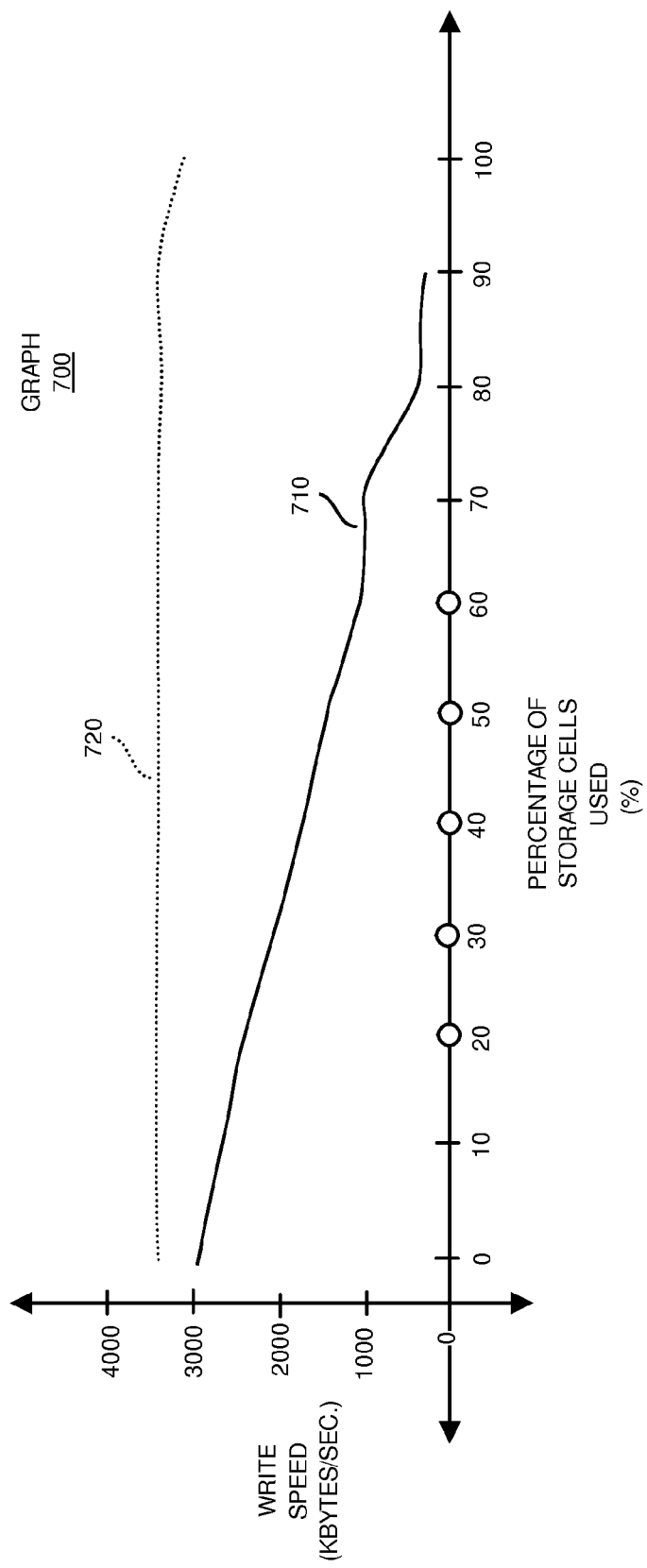
FIG. 7 is an example diagram illustrating a graph of enhanced speed of writing data in a non-volatile memory system according to embodiments herein.

FIG. 7 is an example diagram illustrating a graph of enhanced speed of writing data according to embodiments herein.

As shown, graph 700 illustrates different possible speeds of writing data to non-volatile memory system 110 depending upon a percentage of used storage cells (i.e., storage cells in non-volatile memory system 110 that currently store data).

More particularly, line 710 represents hypothetical speeds of writing data to non-volatile memory system 110 using conventional techniques such as those that merely store corresponding data without regards to the type of data being stored. In such an instance, line 710 indicates that a speed of writing received data to non-volatile memory system 110 substantially decreases as the percent of used storage cells in non-volatile memory system 110 increases.

In contrast, line 720 represents different possible speeds of writing data to non-volatile memory system 110 using techniques as described herein. In general, line 720 indicates that a speed of writing data to non-volatile memory system 110 using selection logic 135 is substantially the same regardless of the percentage of storage cells in non-volatile memory system 110 that are used to store data.

Figure 8:
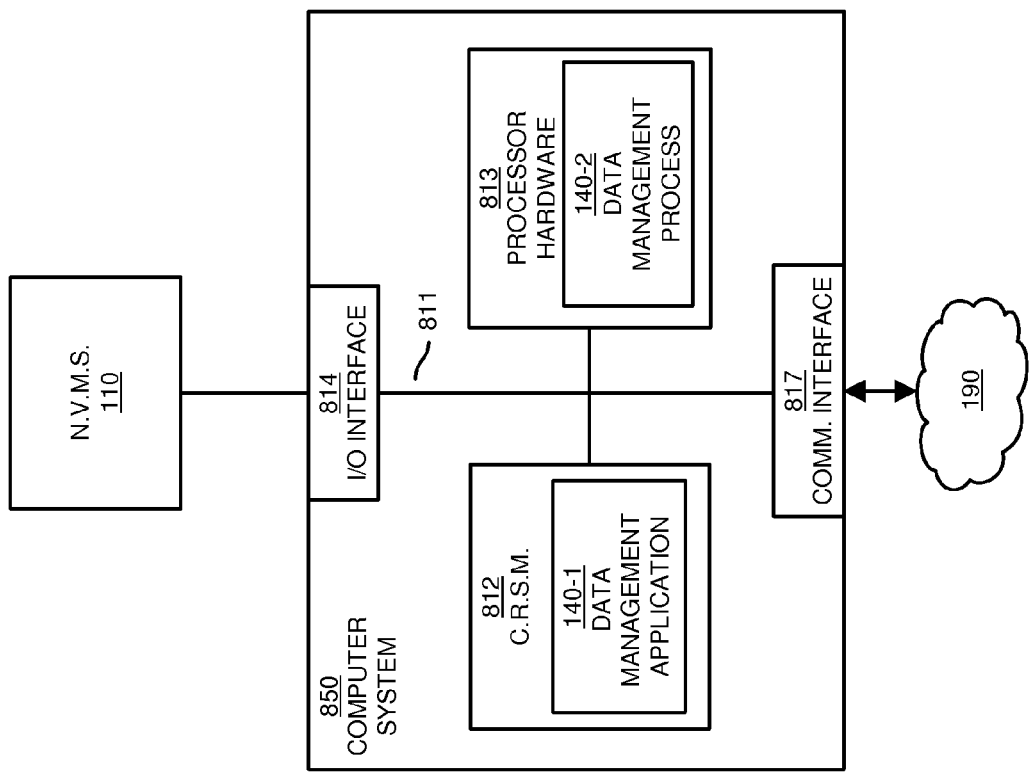
FIG. 8 is an example diagram illustrating computer processor hardware in which to execute one or more methods according to embodiments herein.

FIG. 8 is an example block diagram of computer processor hardware to implement any of the operations as discussed herein according to embodiments herein.

Computer system 850 is a resource to execute any of the operations as discussed herein. In one embodiment, processing environment 100 includes a computer system 850 to execute data management application 140-1.

As further shown, computer system 850 of the present example can include an interconnect 811 that couples computer readable storage media 812 to processor hardware 813. Computer readable storage medium 812 can be a non-transitory type of media (i.e., any type of hardware storage medium) in which digital information is stored and retrieved by resources such as processor hardware 813 (i.e., one or more processor devices), I/O interface 814, communications interface 817, etc.

Communication interface 817 provides connectivity with network 190 facilitating communication with other resources. I/O interface 814 provides the computer system 850 connectivity to one or more resources such as non-volatile memory system 110. Note that non-volatile memory system 110 can be located within computer system 850. Alternatively, non-volatile memory system 110 can be remotely located with respect to the computer system 850.

Computer readable storage medium 812 can be any hardware storage device such as memory, optical storage, hard drive, floppy disk, etc. In one embodiment, the computer readable storage medium 812 (e.g., a computer readable hardware storage) stores instructions and/or data.

As shown, computer readable storage media 812 is encoded with data management application 140-1 (e.g., software, firmware, etc.) executed by processor 813. Data management application 140-1 can be configured to include instructions to implement any of the operations as discussed herein.

During operation of one embodiment, processor hardware 813 accesses computer readable storage media 812 via the use of interconnect 811 in order to launch, run, execute, interpret or otherwise perform the instructions in data management application 140-1 stored on computer readable storage medium 812.

Execution of the data management application 140-1 produces processing functionality such as data management process 140-2 in processor 813. In other words, the data management process 140-2 associated with processor 813 represents one or more aspects of executing data management application 140-1 within or upon the processor hardware 813 in the computer system 850.

Those skilled in the art will understand that the computer system 850 can include other processes and/or software and hardware components, such as an operating system that controls allocation and use of hardware resources, software resources, etc., to execute data management application 140-1. Data management application 140-1 executes any of the operations associated with file system logic 115, translator logic 125, and selection logic 135.

In accordance with different embodiments, note that computer system 850 may be any of various types of devices, including, but not limited to, a mobile computer, a mobile phone device, a personal computer system, a wireless device, base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, or in general any type of computing or electronic device.

Functionality supported by the different resources will now be discussed via flowcharts in FIG. 9. Note that the processing in the flowcharts below can be executed in any suitable order.

Figure 9:
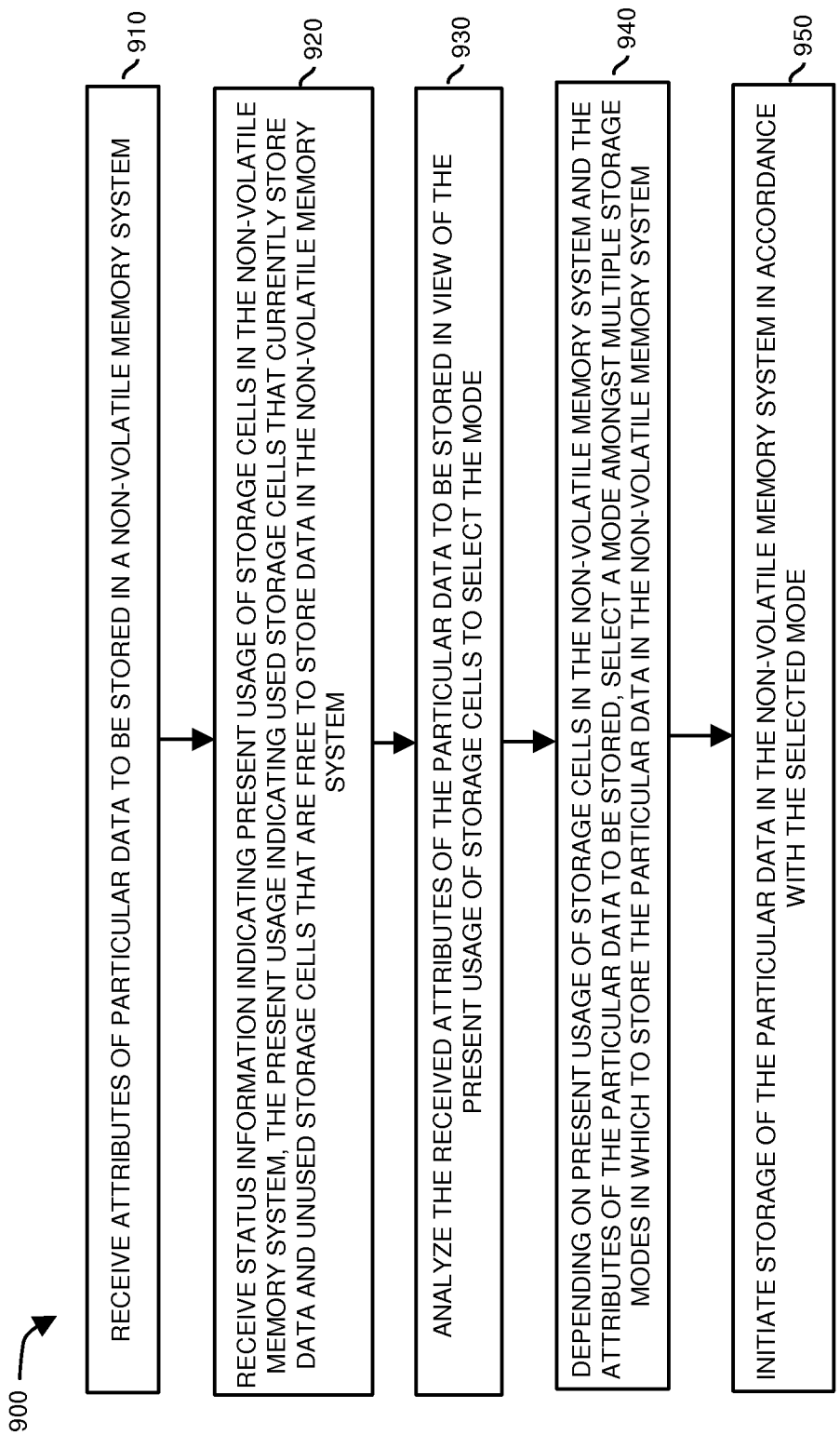
FIG. 9 is an example flowchart illustrating a method according to embodiments herein.

FIG. 9 is a flowchart 900 illustrating an example method according to embodiments. Note that there will be some overlap with respect to concepts as discussed above.

In processing operation 910, the selection logic 135 receives attribute information 160 indicating attributes of particular data 155 to be stored in a non-volatile memory system 110.

In processing operation 920, the selection logic 135 receives status information 170 indicating present usage of storage cells in the non-volatile memory system 110. The present usage indicates used storage cells that currently store data and unused storage cells that are free to store data in the non-volatile memory system 110.

In processing operation 930, the selection logic 135 analyzes the received attribute information 160 of the particular data 210 to be stored in view of the present usage of storage cells as specified by the status information 170 to select a mode of storage.

In processing operation 940, depending on present usage of storage cells in the non-volatile memory system 110 and the attributes as specified by the attribute information 170 of the particular data 155 to be stored, the selection logic 135 allocates a cluster of storage cells and selects a mode amongst the multiple storage modes in which to store the particular data 155 in the non-volatile memory system 110.

In processing operation 950, the selection logic 135 initiates storage of the particular data 155 in the allocated storage cells in accordance with the selected mode.

Figure 10:
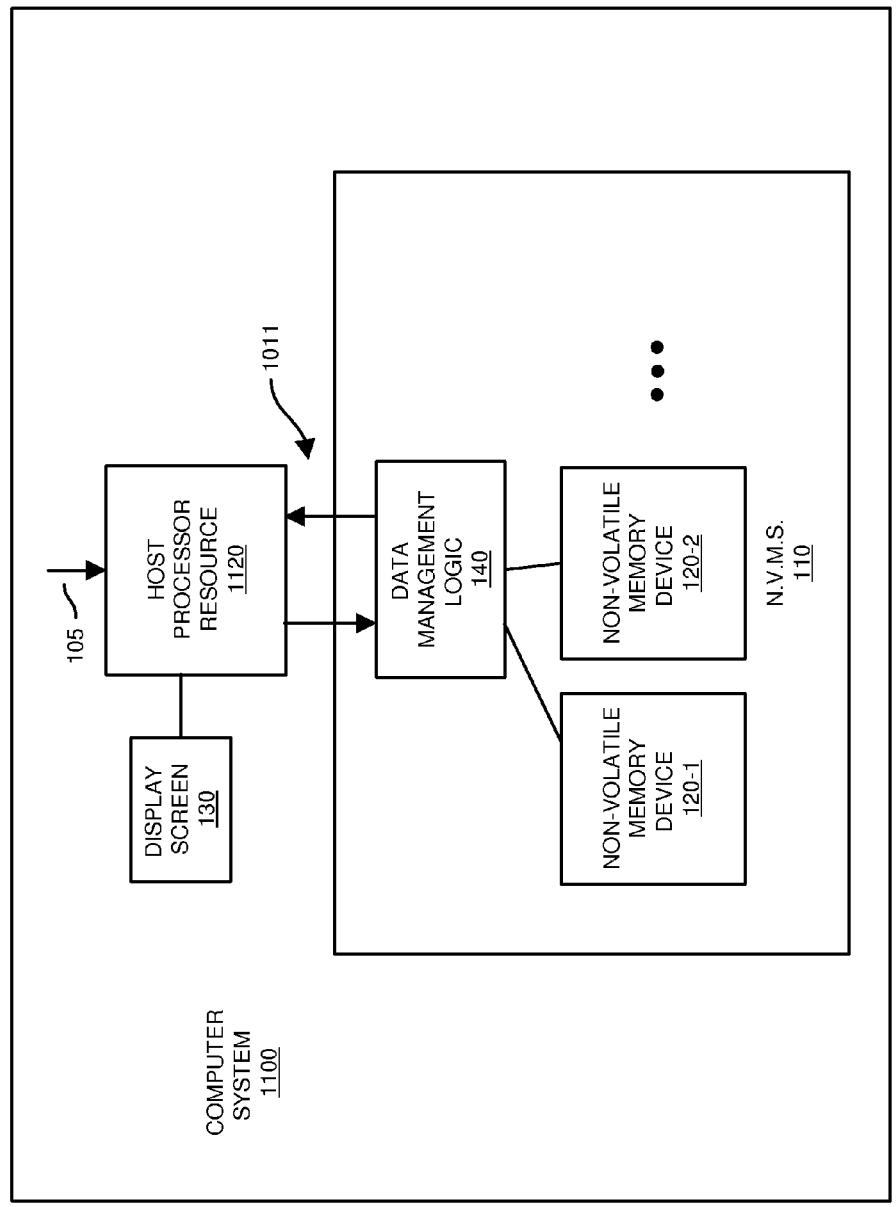
FIG. 10 is an example diagram illustrating an example computer system and use of corresponding data management logic to allocate storage cells and efficiently store corresponding data according to embodiments herein.

FIG. 10 is an example diagram illustrating use of a non-volatile memory system in a respective computer system according to embodiments herein.

As shown, computer system 1100 can include a host processor resource 1120 and a non-volatile memory system 110 to store data. In one embodiment, host processor resource 1120 is computer processor hardware including one or more processor devices. Computer system 1100 can be any suitable type of resource such as a personal computer, mobile computer, tablet, cellular phone, mobile device, camera, etc., using non-volatile memory system 110 to store data.

By way of a non-limiting example, memory system 110 can be a solid-state drive used to store data.

In one embodiment, host processor resource 1120 has access to non-volatile memory system 110 via interface 1011. Interface 1011 can be any suitable link enabling data transfers. For example, the interface 1011 can be a SCSI (Small Computer System Interface), SAS (Serial Attached SCSI), SATA (Serial Advanced Technology Attachment), USB (Universal Serial Bus), PCIE (Peripheral Component Interconnect Express) bus, etc.

Via interface 1011, the host processor resource 1120 of computer system 1100 is able to retrieve data from and store data in non-volatile memory system 110.

As an example, assume that input 105 is a command for the host processor resource 1120 to retrieve data from nonvolatile memory system 110. The host processor resource 1120 performs the respective function (data retrieval) as specified by input 105 from a user. To achieve this end, the host processor resource 1120 transmits a request over interface 1011 to data management logic 140 for retrieval of data at a specified logical address. The data management logic 140 maps the logical address to an appropriate physical address and retrieves the data from non-volatile memory system 110. Data management logic 140 transmits the retrieved data to host processor resource 1120.

In one non-limiting example embodiment, the host processor resource 1120 initiates display of an image on display screen 130 depending on the data received from the data management logic 140.

As a further example, input 105 can specify to store data in non-volatile memory system 110. In such an instance, the host processor resource 1120 receives the request and communicates with data management logic 140 to store data at a logical address as specified by the host processor resource 1120. In response to receiving the request, via data storage control information 175, the translator logic 125 of data management logic 140 initiating storage of a respective data in the non-volatile memory system 110 as described herein.

Note that no element, operation, or instruction employed herein should be construed as critical or essential to the application unless explicitly described as such. Also, as employed herein, the article "a" is intended to include one or more items. Where only one item is intended, the term "one" or similar language is employed. Further, the phrase "based on" is intended to mean "based, at least in part, on" unless explicitly stated otherwise.

While details have been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the embodiments herein are presented in the following claims.

The invention claimed is:

1. A method comprising:
  receiving attribute information indicating attributes of particular data to be stored in a non-volatile memory system;

depending on present usage of storage cells in the non-volatile memory system and the attributes of the particular data to be stored, selecting a mode amongst multiple storage modes in which to store the particular data in the non-volatile memory system; and initiating storage of the particular data in the non-volatile memory system in accordance with the selected mode.

2. The method as in claim 1, wherein selecting the mode includes:

receiving status information indicating the present usage of storage cells in the non-volatile memory system, the present usage indicating used storage cells that currently store data and unused storage cells that are free to store data in the non-volatile memory system;

analyzing the received attributes of the particular data in view of the present usage of storage cells to select the mode.

3. The method as in claim 2, wherein the selected mode is a most efficient mode amongst the multiple storage modes to store the particular data in the non-volatile memory system.

4. The method as in claim 1, wherein the particular data to be stored is a replacement to current data stored in a first page of a block in the non-volatile memory system; and wherein initiating storage of the particular data in the non-volatile memory system in accordance with the selected mode includes: initiating storage of the particular data in a second page of the block in response to detecting that the particular data is a replacement to current data stored in the first page of the block.

5. The method as in claim 1, wherein the particular data to be stored is a replacement to current data stored in a first block in the non-volatile memory system; and wherein initiating storage of the particular data in the non-volatile memory system in accordance with the selected mode includes: initiating storage of the particular data in a second block of the non-volatile memory system in response to detecting that the particular data replaces current data stored in the first block.

6. The method as in claim 1, wherein the particular data to be stored in the non-volatile memory system includes new data to replace old data stored in the non-volatile memory system; and wherein the multiple storage modes includes at least a first storage mode and a second storage mode, the first storage mode specifying a first manner in which to carry out writing of the new data and managing the old data stored in the non-volatile memory system, the second storage mode specifying a second manner in which to carry out writing of the new data and managing the old data stored in the non-volatile memory system.

7. The method as in claim 6, wherein the first storage mode specifies to store the new data in a same block in the non-volatile memory system in which the old data is stored; and wherein the second storage mode specifies to store the new data in a different block of the non-volatile memory system than a block in which the old data is stored.

8. The method as in claim 6, wherein selecting the mode includes:

in response to detecting that the new data to be stored is application data:

selecting the first storage mode to store the particular data in the non-volatile memory system, the first storage mode writing the new data in a block of the non-volatile memory system that does not store the old data.

9. The method as in claim 6, wherein selecting the mode includes:

in response to detecting that the particular data to be stored is metadata, selecting the second storage mode to write the new data in the non-volatile memory system, the second mode writing the new data to the non-volatile memory system prior to moving the old data stored in the non-volatile memory system.

10. The method as in claim 1, wherein initiating storage of the data in the non-volatile memory system includes:

partitioning the particular data into multiple segments;

identifying storage cells in a set of blocks in the non-volatile memory system allocated to store the data; and storing the multiple segments in pages of the storage cells of the set of blocks in a manner as specified by the selected mode.

11. The method as in claim 10, wherein the multiple segments includes at least a first segment of data and a second segment of data, the first segment of data being a replacement of data currently stored in a first block of the non-volatile memory system;

wherein storing the multiple segments in pages of the set of blocks as specified by the selected mode includes:

storing the first segment of data and the second segment of data in a second block of the non-volatile memory system; and erasing storage cells in the first block.

12. The method as in claim 10, wherein the multiple segments includes at least a first segment of data and a second segment of data, the first segment of data being a replacement to data currently stored in a first block of the non-volatile memory system;

wherein storing the multiple segments in pages of the set of blocks as specified by the selected mode includes:

storing the first segment of data in the first block of the non-volatile memory system; and storing the second segment of data in the first block of the non-volatile memory system.

13. The method as in claim 1, wherein the particular data is a sequence of logical segments of data, none of which are replacement data to each other, the method further comprising:

erasing a given block of pages in the non-volatile memory system; and initiating storage of the sequence of logical segments of data in the pages of the given block.

14. An apparatus comprising:

a non-volatile memory system; and selection logic operable to:

receive attribute information indicating attributes of particular data to be stored in the non-volatile memory system;

depending on present usage of storage cells in the non-volatile memory system and the attributes of the particular data to be stored, select a mode amongst multiple storage modes in which to store the particular data in the non-volatile memory system; and initiate storage of the particular data in the non-volatile memory system in accordance with the selected mode.

15. The apparatus as in claim 14, wherein the selection logic is further operable to:

receive status information indicating the present usage of storage cells in the non-volatile memory system, the present usage indicating used storage cells that currently store data and unused storage cells that are free to store data in the non-volatile memory system; and analyze the received attributes of the particular data in view of the present usage of storage cells to select the mode.

16. The apparatus as in claim 15, wherein the selected mode is a most efficient mode amongst the multiple storage modes to store the particular data in the non-volatile memory system.

17. The apparatus as in claim 14, wherein the particular data to be stored is a replacement to current data stored in a first page of a block in the non-volatile memory system; and wherein storage of the particular data in the non-volatile memory system in accordance with the selected mode includes: initiating storage of the particular data in a second page of the block in response to detecting that the particular data is a replacement to current data stored in the first page of the block.

18. The apparatus as in claim 14, wherein the particular data to be stored is a replacement to current data stored in a first block in the non-volatile memory system; and wherein storage of the particular data in the non-volatile memory system in accordance with the selected mode includes: storage of the particular data in a second block of the non-volatile memory system in response to detecting that the particular data replaces current data stored in the first block.

19. The apparatus as in claim 14, wherein the particular data to be stored in the non-volatile memory system includes new data to replace old data stored in the non-volatile memory system; and wherein the multiple storage modes includes at least a first storage mode and a second storage mode, the first storage mode specifying a first manner in which to carry out writing of the new data and managing the old data stored in the non-volatile memory system, the second storage mode specifying a second manner in which to carry out writing of the new data and managing the old data stored in the non-volatile memory system.

20. The apparatus as in claim 19, wherein the first storage mode specifies to store the new data in a same block in the non-volatile memory system in which the old data is stored; and wherein the second storage mode specifies to store the new data in a different block of the non-volatile memory system than a block in which the old data is stored.

21. The apparatus as in claim 19, wherein the selection logic is further operable to:

in response to detecting that the new data to be stored is application data:

select the first storage mode to store the particular data in the non-volatile memory system, the first storage mode writing the new data in a block of the non-volatile memory system that does not store the old data.

22. A computer system including the apparatus as in claim 14, the computer system comprising:

a host processor resource, the host processor resource initiating storage of the particular data in the non-volatile memory system.

23. The computer system as in claim 22 further comprising:

a display screen on which to render an image based on data stored in the non-volatile memory system.

24. Computer-readable storage hardware having instructions stored thereon, the instructions, when carried out by computer processor hardware, cause the computer processor hardware to perform operations of:

receiving attributes of data to be stored in a non-volatile memory system;

depending on present usage of storage cells in the non-volatile memory system and the attributes of the data to be stored, selecting a mode amongst multiple storage modes in which to store the data in the non-volatile memory system; and initiating storage of the data in the non-volatile memory system in accordance with the selected mode.

25. The computer-readable storage hardware as in claim 24, wherein the instructions further cause the computer processor hardware to perform operations of:

receiving status information indicating the present usage of storage cells in the non-volatile memory system, the present usage indicating used storage cells that currently store data and unused storage cells that are free to store data in the non-volatile memory system; and analyzing the received attributes of the particular data in view of the present usage of storage cells to select the mode.

* * * * *